(12) United States Patent
Yuan et al.

(10) Patent No.: US 11,315,960 B2
(45) Date of Patent: Apr. 26, 2022

(54) THIN FILM TRANSISTOR STRUCTURE AND MANUFACTURING METHOD THEREOF, CIRCUIT STRUCTURE, DISPLAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Can Yuan, Beijing (CN); Zhenfei Cai, Beijing (CN); Yongqian Li, Beijing (CN); Pan Xu, Beijing (CN); Zhidong Yuan, Beijing (CN); Meng Li, Beijing (CN); Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 709 days.

(21) Appl. No.: 16/097,875

(22) PCT Filed: Mar. 14, 2018

(86) PCT No.: PCT/CN2018/078963
§ 371 (c)(1),
(2) Date: Oct. 31, 2018

(87) PCT Pub. No.: WO2018/205740
PCT Pub. Date: Nov. 15, 2018

(65) Prior Publication Data
US 2021/0257393 A1    Aug. 19, 2021

(30) Foreign Application Priority Data

May 11, 2017 (CN) .......................... 201720520432.4

(51) Int. Cl.
*H01L 27/12* (2006.01)
*H01L 29/786* (2006.01)
*H01L 27/32* (2006.01)

(52) U.S. Cl.
CPC ........ *H01L 27/1251* (2013.01); *H01L 27/127* (2013.01); *H01L 27/1222* (2013.01); *H01L 29/78696* (2013.01); *H01L 27/3262* (2013.01)

(58) Field of Classification Search
CPC ............. H01L 27/1251; H01L 27/1222; H01L 27/127; H01L 27/3262; H01L 29/78696
(Continued)

(56) References Cited

U.S. PATENT DOCUMENTS

2002/0149053 A1* 10/2002 Tsunoda .............. H01L 29/6675
257/347
2003/0015703 A1* 1/2003 Yamazaki ........... H01L 29/6675
257/66
(Continued)

FOREIGN PATENT DOCUMENTS

CN      101504946 A      8/2009
CN      102280441 A      12/2011
(Continued)

OTHER PUBLICATIONS

International Search Report and Written Opinion for Application No. PCT/CN2018/078963, dated Jun. 11, 2018, 10 Pages.

*Primary Examiner* — Dzung Tran
(74) *Attorney, Agent, or Firm* — Brooks Kushman P.C.

(57) ABSTRACT

A thin film transistor structure and a manufacturing method thereof, a circuit structure, a display substrate and a display device are provided. The thin film transistor structure includes: a base plate, and a first thin film transistor and a
(Continued)

second thin film transistor stacked on the base plate. The first thin film transistor and the second thin film transistor share a same active layer.

17 Claims, 5 Drawing Sheets

(58) Field of Classification Search
USPC .......................................................... 257/72
See application file for complete search history.

(56) References Cited

U.S. PATENT DOCUMENTS

| | | | |
|---|---|---|---|
| 2003/0020065 A1* | 1/2003 | Honda | H01L 29/78645 257/67 |
| 2003/0141504 A1* | 7/2003 | Kuwabara | H01L 29/78648 257/66 |
| 2003/0164500 A1* | 9/2003 | Tsunoda | H01L 29/78636 257/72 |
| 2009/0200613 A1 | 8/2009 | Uemura et al. | |
| 2011/0303984 A1 | 12/2011 | Chen et al. | |
| 2014/0145200 A1 | 5/2014 | Zhang | |
| 2018/0097035 A1* | 4/2018 | Zeng | H01L 51/0021 |

FOREIGN PATENT DOCUMENTS

| | | |
|---|---|---|
| CN | 102969311 A | 3/2013 |
| CN | 103268876 A | 8/2013 |
| CN | 206774547 U | 12/2017 |

* cited by examiner

THIN FILM TRANSISTOR STRUCTURE AND MANUFACTURING METHOD THEREOF, CIRCUIT STRUCTURE, DISPLAY SUBSTRATE AND DISPLAY DEVICE

CROSS-REFERENCE TO RELATED APPLICATION APPLICATIONS

This application is the U.S. national phase of PCT Application No. PCT/CN2018/078963 filed on Mar. 14, 2018, which claims priority to Chinese Patent Application No. 201720520432.4 filed on May 11, 2017, which are incorporated herein by reference in their entireties.

TECHNICAL FIELD

The present disclosure relates to the field of display technology, in particular to a thin film transistor structure and a manufacturing method thereof, a circuit structure, a display substrate and a display device.

BACKGROUND

Thin film transistor is a key component in a display panel. An area where the thin film transistor is located is opaque. For a display panel provided with multiple thin film transistors, an area occupied by the multiple thin film transistors in the whole display panel may have some effect on displaying of the display panel.

For example, the Gate Driver on Array (GOA) technique is widely used in display panels. In the GOA technique, a gate electrode switching circuit is integrated on a thin film transistor structure in a display panel to form a scanning driver for the display panel, thereby reducing the product cost on aspects of material cost and manufacturing process. Such gate electrode switching circuit integrated on the thin film transistor structure is called as a GOA circuit. Usually, multiple thin film transistors are formed in the GOA circuit, and the GOA circuit may occupy a large area of the whole display panel; hence, borders of the display panel may be relatively wide, and it is not advantageous for a narrow-bezel design.

How to reduce the area occupied by the multiple thin film transistors in the whole display panel in a premise that the multiple thin film transistors operate normally is an urgent technical problem to be solved by the skilled in the art.

SUMMARY

The present disclosure provides a thin film transistor structure and a manufacturing method thereof, a circuit structure, a display substrate and a display device, which may reduce an area occupied by the thin film transistor structure in a display panel and enhance an aperture ratio of the display panel.

In a first aspect, the present disclosure provides a thin film transistor structure, including: a base plate, and a first thin film transistor and a second thin film transistor that are stacked on the base plate. The first thin film transistor and the second thin film transistor share a same active layer.

Optionally, the first thin film transistor is a bottom-gate thin film transistor and the second thin film transistor is a top-gate thin film transistor.

Optionally, a gate electrode of the first thin film transistor is located below the active layer, and a gate electrode of the second thin film transistor is located above the active layer.

Optionally, the active layer includes a first part and a second part intersecting with each other, a gate electrode of the first thin film transistor extends in a direction parallel with an extending direction of the first part, a gate electrode of the second thin film transistor extends in a direction parallel with an extending direction of the second part, a source electrode and a drain electrode of the first thin film transistor are respectively connected to two end portions of the first part, and a source electrode and a drain electrode of the second thin film transistor are respectively connected to two end portions of the second part.

Optionally, the extending direction of the first part of the active layer is perpendicular to the extending direction of the second part of the active layer and the active layer is in a cross shape.

Optionally, the thin film transistor structure further includes a first gate insulating layer located between the gate electrode of the first thin film transistor and the active layer, and a second gate insulating layer located between the gate electrode of the second thin film transistor and the active layer.

Optionally, the source electrode and the drain electrode of the first thin film transistor and the source electrode and the drain electrode of the second thin film transistor are arranged at a same layer.

Optionally, the source electrode and the drain electrode of the first thin film transistor, and the source electrode and the drain electrode of the second thin film transistor are simultaneously formed through one patterning process.

Optionally, a channel width to length ratio of the first thin film transistor is adjusted by adjusting a width of the gate electrode of the first thin film transistor and a width of the first part of the active layer, and a channel width to length ratio of the second thin film transistor is adjusted by adjusting a width of the gate electrode of the second thin film transistor and a width of the second part of the active layer.

In a second aspect, the present disclosure further provides a manufacturing method for a thin film transistor structure, including: forming a first gate electrode of a first thin film transistor on a base plate; forming a first gate insulating layer; forming an active layer in a cross shape, the active layer including a first part and a second part intersecting with each other; forming an insulating interlayer, patterning the insulating interlayer to form via-holes through which the active layer is exposed, and treating a source electrode contact region and a drain electrode contact region of the active layer to be conductive through the via-holes; forming a pattern of a source-drain metal layer, where the pattern of the source-drain metal layer includes a source electrode and a drain electrode of the first thin film transistor and a source electrode and a drain electrode of a second thin film transistor, the source electrode and the drain electrode of the first thin film transistor are respectively connected to the source electrode contact region and the drain electrode contact region of the first part of the active layer, and the source electrode and the drain electrode of the second thin film transistor are respectively connected to the source electrode contact region and the drain electrode contact region of the second part of the active layer; forming a second insulating layer; and forming a second gate electrode of the second thin film transistor.

Optionally, the gate electrode of the first thin film transistor extends in a direction parallel with an extending direction of the first part, the gate electrode of the second thin film transistor extends in a direction parallel with an extending direction of the second part, the source electrode and the drain electrode of the first thin film transistor are respectively connected to two end portions of the first part, and the source electrode and the drain electrode of the second thin film transistor are respectively connected to two end portions of the second part.

Optionally, the extending direction of the first part of the active layer is perpendicular to the extending direction of the second part of the active layer.

In a third aspect, the present disclosure further provides a display substrate, including the above-described thin film transistor structure.

In a fourth aspect, the present disclosure further provides a circuit structure, including the above-described thin film transistor structure.

Optionally, the circuit structure includes a Gate Driver on Array circuit or a pixel circuit of an Organic Light-emitting Diode display component.

In a fifth aspect, the present disclosure further provides a display device, including the above-described display substrate or the above-described circuit structure.

DETAILED DESCRIPTION

Detailed description based on drawings and specific embodiments are given to better clarify the technical problem to be solved, a technical solution and advantages of embodiments of the present disclosure.

The present disclosure provides, according to embodiments, a thin film transistor structure and a manufacturing method thereof, a circuit structure, a display substrate and a display device, which may reduce an area occupied by the thin film transistor structure in the display panel and enhance an aperture ratio of the display panel.

Figure 1:
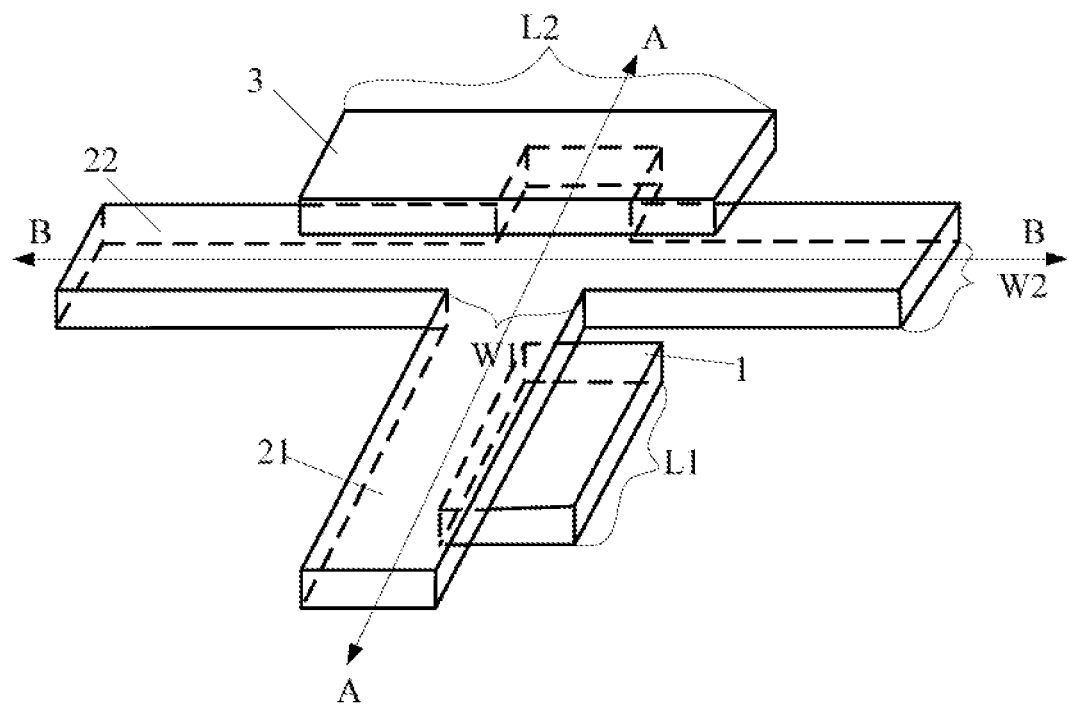
FIG. 1 is a three-dimensional structural schematic diagram of a thin film transistor structure according to some embodiments of the present disclosure.
Figure 2:
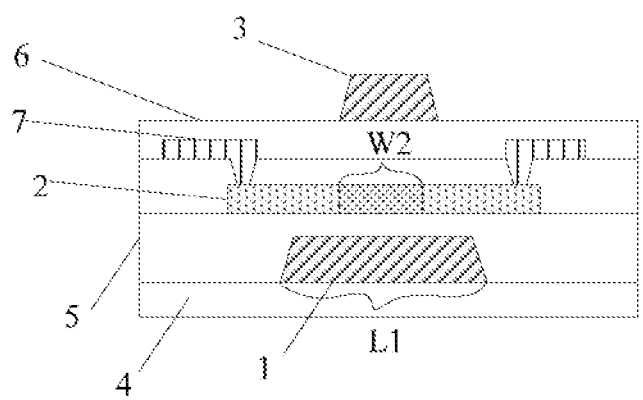
FIG. 2 is a schematic sectional view of the thin film transistor structure taken along direction AA in FIG. 1.
Figure 3:
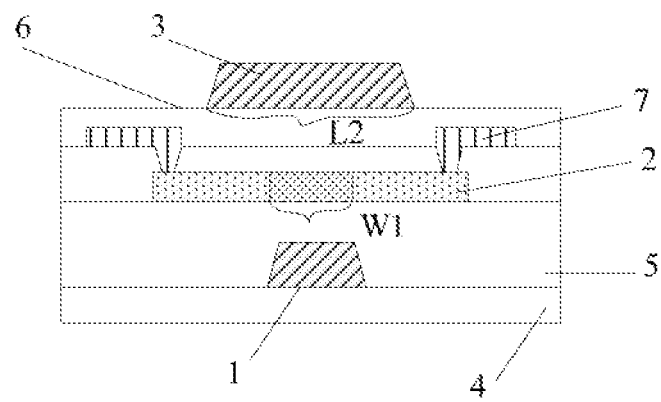
FIG. 3 is a schematic sectional view of the thin film transistor structure taken along direction BB in FIG. 1.

The present disclosure provides a thin film transistor structure according to some embodiments, as shown in FIG. 1 to FIG. 3. FIG. 1 is a three-dimensional structural schematic diagram of a thin film transistor structure according to some embodiments of the present disclosure. FIG. 2 is a schematic sectional view of the thin film transistor structure taken along direction AA in FIG. 1. FIG. 3 is a schematic sectional view of the thin film transistor structure taken along direction BB in FIG. 1.

The thin film transistor structure includes a base plate 4, and a first thin film transistor and a second thin film transistor stacked on the base plate 4. The first thin film transistor and the second thin film transistor share a same active layer 2.

In the embodiments, the first thin film transistor and the second thin film transistor share the same active layer. Since the thin film transistor structure uses a new structure that the first thin film transistor and the second thin film transistor are stacked and share the same active layer, an area occupied by the thin film transistors in the display panel may be reduced, and an aperture ratio of the display panel. In case of applying such thin film transistor structure in a GOA circuit, an area occupied by the GOA circuit can be reduced, and borders of the display panel can be narrower, thereby facilitating realizing narrow-bezel design.

In practical, in some embodiments of the present disclosure, to enable the first thin film transistor and the second thin film transistor stacked in the thin film transistor structure to share the same active layer, the first thin film transistor is usually arranged to be a bottom-gate thin film transistor, and the second thin film transistor is usually arranged to be a top-gate thin film transistor, as shown in FIG. 1. That is, a gate electrode of the first thin film transistor is located below the active layer 2, and a gate electrode of the second thin film transistor is located above the active layer 2. In this way, thin film transistors which are originally arranged at left and right can be stacked, and accordingly, the area occupied by the thin film transistor structure in the display panel can be reduced in the premise that the multiple thin film transistors operate normally.

In practical, in the thin film transistor structure according to some embodiments of the present disclosure, the first thin film transistor and the second thin film transistor may both be P-type transistors or N-type transistors. Optionally, the first thin film transistor and the second thin film transistor may be the P-type transistor and the N-type transistor, respectively.

In practical, as shown in FIG. 1, the active layer 2 has a first part 21 and a second part 22 intersecting with each other. A first gate electrode 1 of the first thin film transistor extends in a direction parallel with an extending direction of the first part 21. A second gate electrode 3 of the second thin film transistor extends in a direction parallel with an extending direction of the second part 22. A source electrode and a drain electrode of the first thin film transistor are respectively connected to two end portions of the first part 21. A source electrode and a drain electrode of the second thin film transistor are respectively connected to two end portions of the second part 22.

Optionally, the extending direction of the first part 21 may be perpendicular to the extending direction of the second part 22, that is, the active layer 2 is in a cross shape.

Furthermore, as shown in FIG. 2 and FIG. 3, the thin film transistor structure further includes: a first gate insulating layer 5, which is located between the first gate electrode 1 of the first thin film transistor and the active layer 2, and a second gate insulating layer 6, which is located between the second gate electrode 3 of the second thin film transistor and the active layer 2.

Optionally, the source electrode and the drain electrode of the first thin film transistor and the source electrode and the drain electrode of the second thin film transistor are arranged at a same layer and are all made though a source-drain metal layer 7, which may simplify structures of the thin film transistors. In addition, when manufacturing the thin film transistor structure, the source electrode and the drain electrode of the first thin film transistor, and the source electrode and the drain electrode of the second thin film transistor can be simultaneously formed through one patterning process, thereby reducing times of pattering processes, simplifying the manufacturing process and lowering the production cost.

In some embodiments of the present disclosure, channel width to length ratios of the first thin film transistor and the second thin film transistor are adjustable. As shown in FIGS. 1-3, the channel width to length ratio of the first thin film transistor is equal to W1/L1 and the channel width to length ratio of the second thin film transistor is equal to W2/L2. The channel width to length ratio of the first thin film transistor can be adjusted by adjusting a width of the first gate electrode 1 and a width of the first part 21. The channel width to length ratio of the second thin film transistor can be adjusted by adjusting a width of the second gate electrode 3 and a width of the second part 22.

A manufacturing method for a thin film transistor structure is further provided according to some embodiments of the present disclosure. FIGS. 5-9 are schematic planar views at different stages of manufacture of the thin film transistor structure. The manufacturing method specifically includes the following steps S101 to S107.

Figure 5:
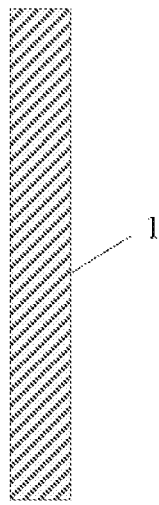
FIG. 5 is a schematic planar view after forming a first gate electrode according to some embodiments of the present disclosure.

S101 includes forming a first gate electrode 1 of a first thin film transistor on a base plate 4, as shown in FIG. 5.

S102 includes forming a first gate insulating layer 5.

Figure 6:
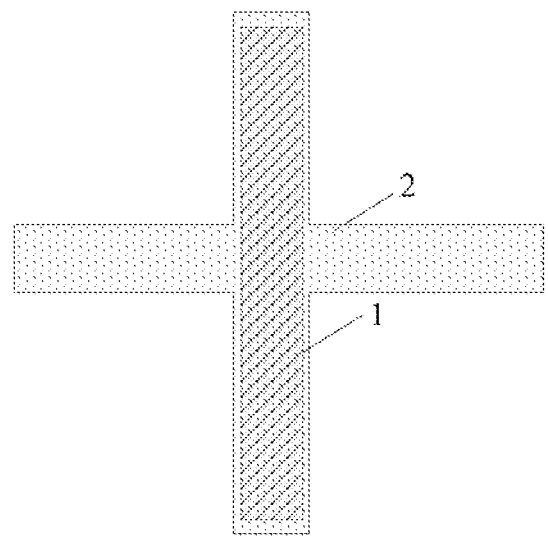
FIG. 6 is a schematic planar view after forming an active layer according to some embodiments of the present disclosure.

S103 includes forming an active layer 2 in a cross shape, as shown in FIG. 6. The active layer 2 may be made of a metallic oxide semiconductor such as IGZO. Optionally, the active layer may be made of amorphous silicon or polysilicon.

Figure 7:
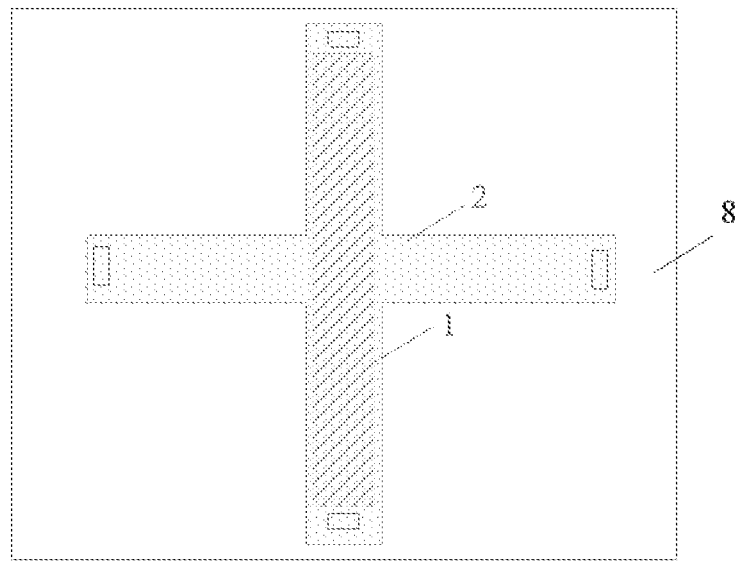
FIG. 7 is a schematic planar view after forming an insulating interlayer according to some embodiments of the present disclosure.

S104 includes forming an insulating interlayer 8, patterning the insulating interlayer 8 to form via-holes through which the active layer 2 is exposed as shown in FIG. 7, and treating a source electrode contact region and a drain electrode contact region of the active layer to be conductive through the via-holes.

Figure 8:
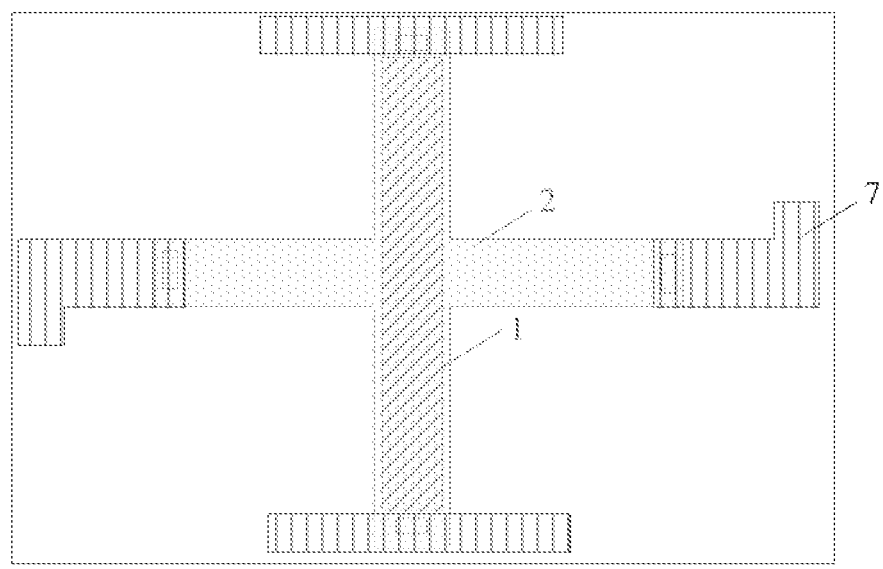
FIG. 8 is a schematic planar view after forming a source-drain metal layer according to some embodiments of the present disclosure.

S105 includes forming a pattern of a source-drain metal layer 7. As shown in FIG. 8, the pattern of the source-drain metal layer 7 includes a source electrode and a drain electrode of the first thin film transistor and a source electrode and a drain electrode of a second thin film transistor. The source electrode of the first thin film transistor is connected to the source electrode contact region of a first part 21, the drain electrode of the first thin film transistor is connected to the drain electrode contact region of the first part 21, the source electrode of the second thin film transistor is connected to the source electrode contact region of the second part 22 and the drain electrode of the second thin film transistor is connected to the drain electrode contact region of the second part 22.

S106 includes forming a second gate insulating layer 6.

Figure 9:
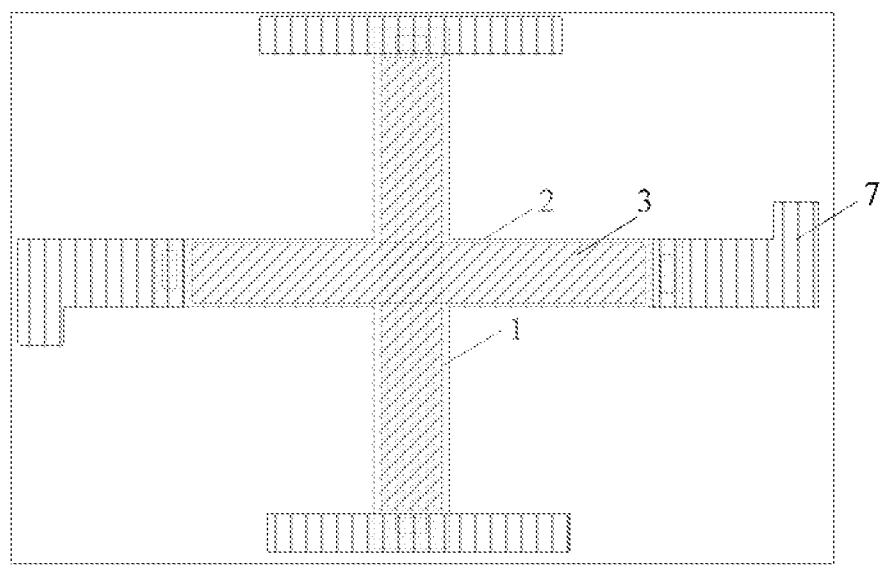
FIG. 9 is a schematic planar view after forming a second gate electrode according to some embodiments of the present disclosure.

S107 includes forming a second gate electrode 3 of the second thin film transistor, as shown in FIG. 9.

The thin film transistor structure in foregoing embodiments may be manufactured through steps S101 to S107 of the manufacturing method. The embodiments directed to the method may be understood in reference to the embodiments directed to the above device and are not repeated herein.

Based on the same inventive concept, a display substrate is provided according to some embodiments of the present disclosure. The display substrate includes the thin film transistor structure according to the foregoing embodiments of the present disclosure. By applying the thin film transistor structure into the display substrate, an area occupied by the thin film transistor structure in the whole display substrate can be reduced, which facilitates enhancing the aperture ratio of the display substrate. Other essential components of the display substrate are all understandable by the ordinary skilled in the art, so they are not repeated herein and should not be regarded as limitations to the present disclosure. Embodiments directed to the display substrate may be understood in reference to the embodiments directed to the thin film transistor structure and are not repeated herein.

Figure 4:
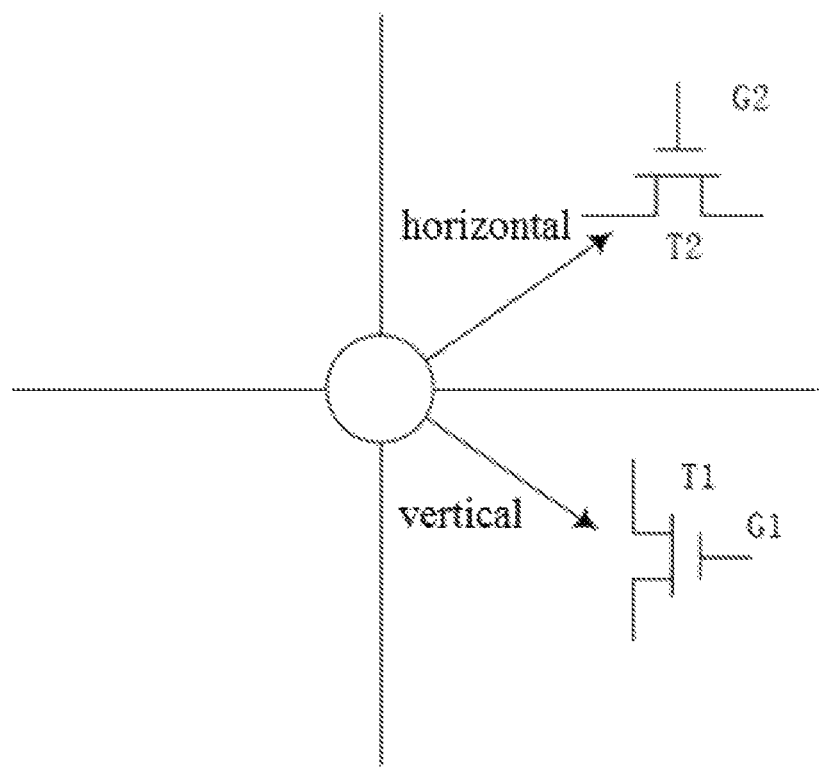
FIG. 4 is a schematic planar view of a display substrate according to some embodiments of the present disclosure.

FIG. 4 is a schematic planar view of a display substrate according to some embodiments of the present disclosure. As shown in FIG. 4, the gate electrode of the first thin film transistor and the gate electrode of the second thin film transistor may be connected to different signal lines. For example, the gate electrode G1 of the first thin film transistor is connected to a horizontal gate line, the source electrode T1 of the first thin film transistor is connected to a vertical data line, the gate electrode G2 of the second thin film transistor is connected to a vertical gate line, and the source electrode T2 of the second thin film transistor is connected to a horizontal data line. With such design on G1, G2, T1 and T2, switches of the first thin film transistor and the second thin film transistor can be controlled independently and a time-division multiplexing function can be achieved.

Based on the same inventive concept, a GOA circuit is provided according to some embodiments of the present disclosure. The GOA circuit includes the thin film transistor structure according to the foregoing embodiments of the present disclosure. By applying the thin film transistor structure into the GOA circuit, an area occupied by the GOA circuit in the whole display substrate can be reduced, which facilitates achieving narrow-bezel design of the display substrate. Other essential components of the GOA circuit are all understandable by the ordinary skilled in the art, so they are not repeated herein and should not be regarded as limitations to the present disclosure. Implementation of the GOA circuit may be understood in reference to the embodiments directed to the thin film transistor structure and is not repeated herein.

Based on the same inventive concept, a pixel circuit of an OLED display component is provided according to some embodiments of the present disclosure. The pixel circuit includes the thin film transistor structure according to the foregoing embodiments of the present disclosure. By applying the thin film transistor structure into the pixel circuit of the OLED display component, an area occupied by the pixel circuit in the whole display substrate can be reduced, which facilitates enhancing the aperture ratio of the pixel circuit. Other essential components of the pixel circuit of the OLED display component are all understandable by the ordinary skilled in the art, so they are not repeated herein and should not be regarded as limitations to the present disclosure. Implementation of the pixel circuit of the OLED display component may be understood in reference to the embodiments directed to the thin film transistor structure and is not repeated herein.

It should be understood, the thin film transistor structure according to the embodiments of the present disclosure can be applied to any circuit structure requiring the thin film transistor structure rather than only the above two circuit structures.

Based on the same inventive concept, a display device is further provided according to some embodiments of the present disclosure, including the thin film transistor structure according to the foregoing embodiments of the present disclosure, a display substrate or a circuit structure. The circuit structure may include a GOA circuit or a pixel circuit of an OLED display component. The display device may be a cellular phone, a tablet computer, a TV set, a display, a laptop, a digital image frame, a navigator or any product or component having a displaying function. Other essential components of the display device are all understandable by the ordinary skilled in the art, so they are not repeated herein and should not be regarded as limitations to the present disclosure.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", "includes", "include", "comprise", "comprises" or "comprising" and the like mean that an element or an article preceding the term contains elements or items and equivalents thereof behind the term, but does not exclude other elements or items. Such terms as "connect", "connected" or "connecting" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It should be understood that when an element such as a layer, a film, a region or a substrate is recited as being above or below another element, the element may be directly above or below the another element, or there may be an interlayer element between the element and the another element.

Optional embodiments of the present disclosure are described hereinabove. It should be pointed out, the ordinary skilled in the art can make various improvements and polishment without departing from the principle of the present disclosure and these improvements and polishment shall fall within the protection scope of the present disclosure.

What is claimed is:

1. A thin film transistor structure, comprising:
   a base plate, and a first thin film transistor and a second thin film transistor that are stacked on the base plate,
   wherein the first thin film transistor and the second thin film transistor share a same active layer;
   wherein the active layer comprises a first part and a second part intersecting with each other, an extending direction of the first part of the active layer is perpendicular to an extending direction of the second part of the active layer, and the active layer is in a cross shape;
   wherein a source electrode and a drain electrode of the first thin film transistor are respectively connected to two end portions of the first part, a source electrode and a drain electrode of the second thin film transistor are respectively connected to two end portions of the second part; and the source electrode and the drain electrode of the first thin film transistor, and the source electrode and the drain electrode of the second thin film transistor are arranged at a same layer.

2. The thin film transistor structure according to claim 1, wherein the first thin film transistor is a bottom-gate thin film transistor, and the second thin film transistor is a top-gate thin film transistor.

3. The thin film transistor structure according to claim 2, wherein a gate electrode of the first thin film transistor is located below the active layer, and a gate electrode of the second thin film transistor is located above the active layer.

4. The thin film transistor structure according to claim 1, wherein a gate electrode of the first thin film transistor extends in a direction parallel with an extending direction of the first part, and a gate electrode of the second thin film transistor extends in a direction parallel with an extending direction of the second part.

5. The thin film transistor structure according to claim 1, further comprising: a first gate insulating layer located between the gate electrode of the first thin film transistor and the active layer, and a second gate insulating layer located between the gate electrode of the second thin film transistor and the active layer.

6. The thin film transistor structure according to claim 4, wherein a channel width to length ratio of the first thin film transistor is adjusted by adjusting a width of the gate electrode of the first thin film transistor and a width of the first part of the active layer, and a channel width to length ratio of the second thin film transistor is adjusted by adjusting a width of the gate electrode of the second thin film transistor and a width of the second part of the active layer.

7. A display substrate, comprising the thin film transistor structure according to claim 1;
   wherein the display substrate further comprises a first gate line and a second gate line, an extending direction of the first gate line is perpendicular to an extending direction of the second gate line;
   a gate electrode of the first thin film transistor is electrically connected to the first gate line, and a gate electrode of the second thin film transistor is electrically connected to the second gate line.

8. A circuit structure, comprising the thin film transistor structure according to claim 1;
   wherein the circuit structure comprises a Gate Driver on Array (GOA) or a pixel circuit of an organic light-emitting diode display component.

9. A display device, comprising a display substrate;
   wherein the display substrate comprises a thin film transistor structure, a first gate line and a second gate line, an extending direction of the first gate line is perpendicular to an extending direction of the second gate line;
   wherein the thin film transistor structure comprises a base plate, and a first thin film transistor and a second thin film transistor that are stacked on the base plate,
   wherein the first thin film transistor and the second thin film transistor share a same active layer;
   wherein the active layer comprises a first part and a second part intersecting with each other, an extending direction of the first part of the active layer is perpendicular to an extending direction of the second part of the active layer, and the active layer is in a cross shape;
   wherein a source electrode and a drain electrode of the first thin film transistor are respectively connected to two end portions of the first part, a source electrode and a drain electrode of the second thin film transistor are respectively connected to two end portions of the second part; and the source electrode and the drain electrode of the first thin film transistor, and the source electrode and the drain electrode of the second thin film transistor are arranged at a same layer;
   wherein a gate electrode of the first thin film transistor is electrically connected to the first gate line, and a gate electrode of the second thin film transistor is electrically connected to the second gate line.

10. A display device, comprising the circuit structure according to claim 8;

wherein the circuit structure comprises a Gate Driver on Array (GOA) or a pixel circuit of an organic light-emitting diode display component.

11. The display substrate according to claim 7, wherein the first thin film transistor is a bottom-gate thin film transistor, and the second thin film transistor is a top-gate thin film transistor.

12. The display substrate according to claim 11, wherein a gate electrode of the first thin film transistor is located below the active layer, and a gate electrode of the second thin film transistor is located above the active layer.

13. The display substrate according to claim 7, wherein a gate electrode of the first thin film transistor extends in a direction parallel with an extending direction of the first part, and a gate electrode of the second thin film transistor extends in a direction parallel with an extending direction of the second part.

14. The display substrate according to claim 13, wherein a channel width to length ratio of the first thin film transistor is adjusted by adjusting a width of the gate electrode of the first thin film transistor and a width of the first part of the active layer, and a channel width to length ratio of the second thin film transistor is adjusted by adjusting a width of the gate electrode of the second thin film transistor and a width of the second part of the active layer.

15. The circuit structure according to claim 8, wherein the first thin film transistor is a bottom-gate thin film transistor, and the second thin film transistor is a top-gate thin film transistor.

16. The circuit structure according to claim 15, wherein a gate electrode of the first thin film transistor is located below the active layer, and a gate electrode of the second thin film transistor is located above the active layer.

17. The circuit structure according to claim 8, wherein a gate electrode of the first thin film transistor extends in a direction parallel with an extending direction of the first part, and a gate electrode of the second thin film transistor extends in a direction parallel with an extending direction of the second part.

* * * * *